United States Patent [19]

Kuehnert

[11] Patent Number: 4,676,862
[45] Date of Patent: Jun. 30, 1987

[54] LAMINATING STATION

[75] Inventor: Hans-Guenter E. Kuehnert, Erzhausen, Fed. Rep. of Germany

[73] Assignee: Hoechst Aktiengesellschaft, Frankfurt am Main, Fed. Rep. of Germany

[21] Appl. No.: 740,768

[22] Filed: Jun. 3, 1985

[30] Foreign Application Priority Data

Jun. 1, 1984 [DE] Fed. Rep. of Germany ....... 3420409

[51] Int. Cl.$^4$ .............................................. B32B 1/00
[52] U.S. Cl. .................. 156/555; 100/93 RP; 100/168; 100/170
[58] Field of Search ............... 156/555; 100/169–172, 100/93 RP

[56] References Cited

U.S. PATENT DOCUMENTS

| | | | |
|---|---|---|---|
| 2,533,832 | 12/1950 | Monroe | 100/171 X |
| 2,737,130 | 3/1956 | Rhodes | 100/171 X |
| 2,829,587 | 4/1958 | Russell | 100/171 |
| 3,020,383 | 2/1962 | Onishi et al. | 100/93 RP |
| 3,246,822 | 4/1966 | Skeen | 100/169 X |
| 3,404,057 | 10/1968 | Heiart | 100/93 RP X |
| 4,080,890 | 3/1978 | Dreher | 100/170 |
| 4,214,936 | 7/1980 | Del Bianco | |

FOREIGN PATENT DOCUMENTS

| | | |
|---|---|---|
| 0040842 | 12/1981 | European Pat. Off. . |
| 0040843 | 12/1981 | European Pat. Off. . |
| 0041642 | 12/1981 | European Pat. Off. . |
| 0058421 | 8/1982 | European Pat. Off. . |
| 0084077 | 7/1983 | European Pat. Off. . |

Primary Examiner—David Simmons
Attorney, Agent, or Firm—Schwartz, Jeffery, Schwaab, Mack, Blumenthal & Evans

[57] ABSTRACT

A laminating station includes fixed parts and movably mounted parts, the latter forming, together with a torsion tube and a laminating roller, a parallel rocker. A second laminating roller and a spacer tube are mounted in the fixed parts of the laminating station. The two laminating rollers and under them the torsion tube and the spacer tube are mounted in side walls of the laminating station. The nip between the two laminating rollers is adjustable, and the movable parts are pivotable about the torsion tube, which functions as an axle. The laminating pressure between the two laminating rollers is fixed by means of one or two set screws and associated preset screws. The tips of the set screws press on the preset screws which, surrounded by compression springs, are enclosed in housings which are arranged underneath collars of the movable parts of the laminating station.

16 Claims, 5 Drawing Figures

LAMINATING STATION

BACKGROUND OF THE INVENTION

The invention relates to a laminating station with two heated laminating rollers, between which there is an adjustable nip.

Lamination carriers, such as, for example multi-layers, metal plates, carrier boards for printed circuits and the like, after being cleaned, washed and dried, are supplied to a laminating station or to a film roller mechanism, in which a film is laminated under pressure and heat onto the opposite sides of a carrier.

Preliminary published European Patent Applications No. 0,040,842, No. 0,040,843, and No. 0.041,642 have disclosed laminating devices, in which a substrate or a carrier is laminated on both sides with a dry resist under applied pressure. The dry resist for the particular side of a carrier to be laminated, for example a carrier board for printed circuits, is drawn off from a supply roll and supplied to a pair of liminating rollers, through the nip of which run the two dry-resist films and the carrier located between them. Before lamination, a thin liquid layer is coated onto the surface of the carrier or the carrier board for printed circuits and forms an intermediate layer between the surface of the carrier board and the particular dry-resist film during lamination. This thin liquid layer is removed from the surface of the circuit board, during lamination, by being absorbed into the dry-resist film.

U.S. Pat. No. 4,214,936 relates to a laminating apparatus in which horizontally transported boards, which are moved forward continuously and contact-heated, are laminated on both sides, the peripheral speed of the laminating rollers being greater than the feed speed of the boards. As soon as a sensor detects the rear edge of the preheated board shortly before it enters the nip between the laminating rollers, the latter are stopped only after a certain delay time allowing the rear edge of the board to pass through the laminating nip. When the front edge of the following board is detected, the laminating rollers start to rotate again and the board which has entered the nip is laminated.

European Patent Application No. 0,058,421 makes known a laminating station with two laminating rollers which are both driven from the same motor via sprocket wheels. As soon as a board to be laminated approaches the laminating rollers, the front edge of the board is detected by a sensor, the signal of which sets in motion the drive motor for the laminating rollers. A signal from a second sensor which detects the front edge of the board triggers the closing of the laminating rollers. The laminating rollers close at the moment when the front edge of the board reaches the nip between the rollers. When the rear edge of the board passes a further sensor, a signal which opens the laminating rollers again is generated. The laminating rollers are opened and closed by means of a crank mechanism.

U.S. Pat. No. 4,214,936 describes a laminating station comprising two heated laminating rollers, the upper laminating roller of which is pressed against the fixed lower roller by a pneumatic pressure cylinder. The pressure cylinder exerts an appropriate pressure force of the order to magnitude of approximately 25 N on the two ends of the movable axle of the upper laminating roller. A sensor detects the front edge of a board to be laminated, which is transported towards the laminating station. The sensor signal causes the laminating rollers to rotate. The board and the dry-resist films to be laminated onto both sides of it press open the nip between the laminating rollers, so that these materials can run through.

With known laminating stations, either there is present a nip between the laminating rollers or the laminating rollers are pressed together pneumatically by means of a predetermined pressure force, and are pushed apart to the width of a nip only by the composite structure comprising a board and the films to be laminated onto its, so that the composite structure can be transported through between the laminating rollers. It is obvious that, as regards material thicknesses of the composite structure, which can be, for example, in the range from 0.5 to 7 mm, problems can arise when the laminating rollers are pushed apart. Also, when the material thicknesses vary it is not always expedient to work with a constant laminating pressure for all material thicknesses, such as is exerted in the known laminating stations. When the thickness of the composite structure comprising the board and resist films changes, or different laminating pressures are required for varying material properties, time-consuming conversion work has to be carried out on the known laminating station in order to vary the nip distance between the laminating rollers. This is accomplished through removal and readjustment of at least one of the laminating rollers, through variation of the working pressure of the pneumatic cylinder, or even through exchange of the pneumatic cylinder for another cylinder with a different characteristic. These procedures result in a change in the laminating pressure of the rollers exerted on the composite structure comprising the board and resist films.

In known laminating stations, there is also the problem that one laminating roller is often not mounted exactly parallel to the other laminating roller in every position and at every nip distance. This means that the carriers, such as, for example, circuit boards, experience slight distortion when they run through the nip between the laminating rollers. Relatively long film sheets thus cannot be laminated parallel to the edges of the carrier in the direction of run.

SUMMARY OF THE INVENTION

It is accordingly an object of the invention to provide a laminating station which makes it possible, in a time-saving way and without conversion work, to change the nip between the laminating rollers.

Another object of the invention is to provide a laminating station, as above, which permits variation of the laminating pressure exerted by the laminating rollers on the composite structure.

Still another object of the invention is to provide a laminating station, as above, in which a change of the nip between the laminating rollers which is carried out on one side is transmitted with a high degree of accuracy to the other side of the laminating rollers.

The objects of the invention are achieved, according to the invention, when one laminating roller and a torsion tube are mounted in movable parts, and the other laminating roller and a spacer tube are mounted in fixed parts of the laminating station, and when the first laminating roller, the torsion tube and the two movably mounted parts form a parallel rocker, of which the pressure force on a carrier to be laminated is adjustable.

In an embodiment of the invention, the laminating rollers are arranged above the torsion tube and the spacer tube, and the movable parts are pivotable about the torsion tube functioning as an axle and mounted in side walls of a frame. To set the nip between the laminating rollers, there is at least one adjusting device which is engaged with one of the fixed parts and against which rests the corresponding movable part, or which is engaged with one of the movable parts and against which rests the corresponding fixed part. The adjusting device is appropriately a set screw screwed horizontally into the fixed part, and the movable part of the laminating station rests against the screw head of the set screw.

More specifically, a laminating station for laminating carriers according to the invention comprises a pair of heated laminating rollers having an adjustable nip therebetween, one roller being mounted on both sides in movable parts of the laminating station, the second roller being mounted on both sides in fixed parts of the laminating station. A torsion tube is mounted in the movable parts with the first roller, and a spacer tube is mounted in the fixed parts with the second roller. The movable parts, the first roller and the torsion tube form a parallel rocker which exerts an adjustable pressure on a carrier as the carrier passes through the nip.

BRIEF DESCRIPTION OF THE DRAWINGS

The invention is described in more detail below with reference to exemplary embodiments illustrated in the drawings, wherein.

DETAILED DESCRIPTION OF THE PREFERRED EMBODIMENTS

Figure 1:
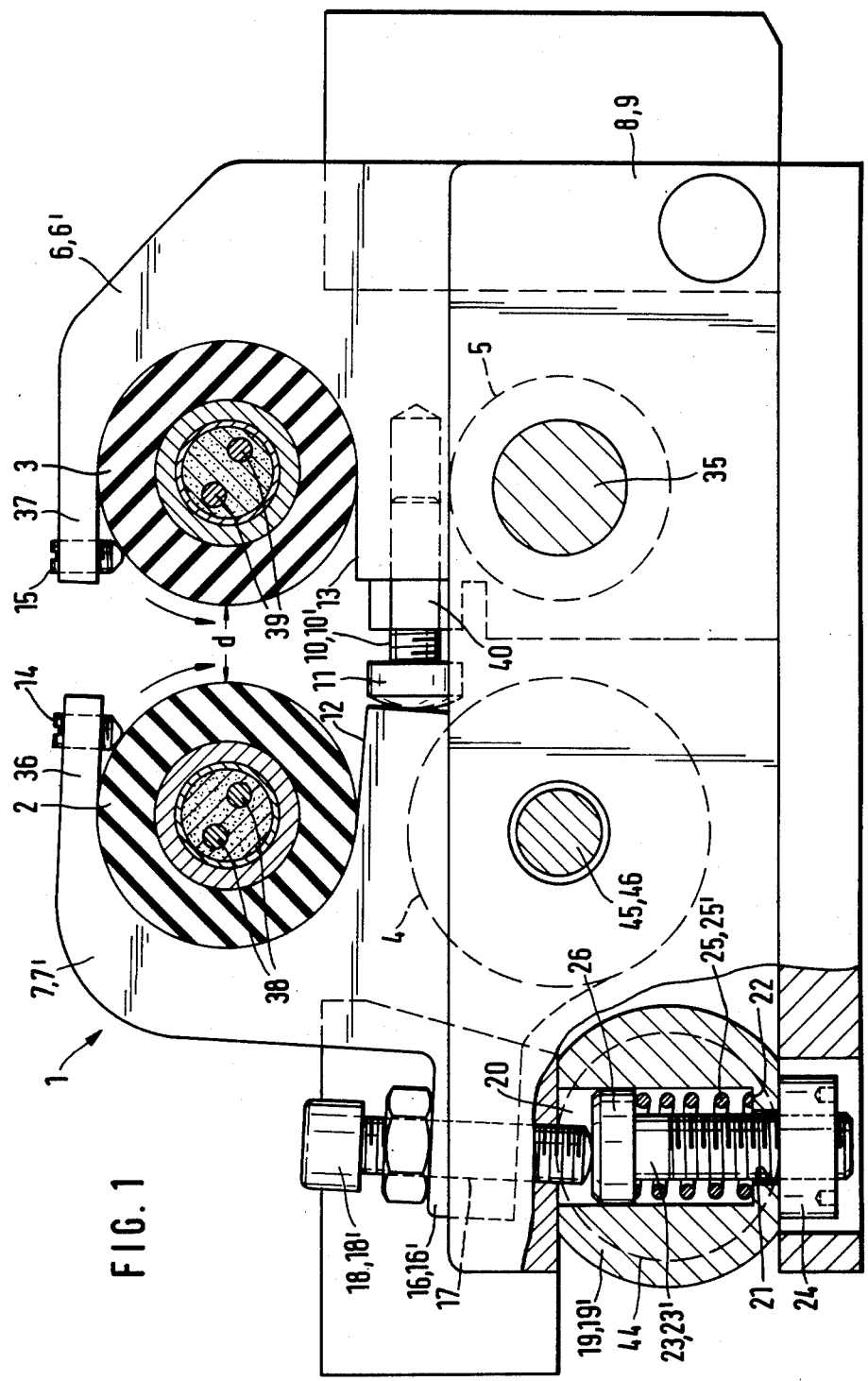
FIG. 1 shows a side view, partially cut open, of a first embodiment of the laminating station according to the invention.

The laminating station 1 illustrated in a side view in FIG. 1 comprises fixed parts 6, 6' and movably mounted parts 7, 7' which are designed, together with a laminating roller 2 and a torsion tube 4, as a parallel rocker and which press the laminating roller 2 by means of a specific pressing force onto a carrier (not shown) which is to be laminated and which is transported through the nip d between two laminating rollers 2 and 3. The parts 6, 6' and 7, 7' are arranged symmetrically relative to the center of the laminating station 1, as is evident from the exemplary embodiment according to FIG. 3. In FIG. 1, only one of the two parts can be seen in the view in each case. Underneath the laminating rollers 2 and 3, the torsion tube 4 and a spacer tube 5 are mounted in side walls 8, 9 (see FIG. 3), of which only the front side wall 8 can be seen in FIG. 1, of the laminating station 1. The peripheral speed of the laminating rollers 2 and 3 is generally greater than the transport speed of the carrier which is supplied from above and aligned vertically to the two laminating rollers 2 and 3 from a heating device (not shown). The laminating roller 3 is mounted fixedly in place in the fixed parts 6, 6', while the laminating roller 2 is mounted fixedly in place in the movable parts 7, 7' the movement of which makes it possible to vary the nip d between the laminating rollers within predetermined limits. The nip d can, for example, be set to an amount on the order of magnitude of 0.5 to 10 mm.

The cores of the two laminating rollers 2 and 3 are heated by heating conductors 38 and 39 respectively. The movable parts 7, 7' of the laminating station 1 are pivotable, together with the torsion tube 4 which is mounted in the side walls 8 and 9 by means of stub axles 45, 46, as explained in more detail below with reference to FIG. 2.

To adjust the nip d between the two laminating rollers 2 and 3, there are one or two adjusting devices 10, 10' with set screws which are engaged with the fixed parts 6, 6' and against which rest the movable parts 7, 7'. The set screws are, for example, screwed horizontally into the fixed parts 6, 6', the threaded hole having at least a length equal to the length of the set screw. The set screws are screwed into the threaded hole according to the size of the desired nip d between the laminating rollers 2 and 3 and are fixed in position by means of a lock nut 40. The movable parts 7, 7' of the laminating station 1 rest by means of a stop surface against the respective screw head 11 of the set screws.

The movable parts 7, 7' 6, 6' of the parallel rocker each have a tongue-shaped jaw 12 and 13 (see FIG. 5) for receiving the laminating roller 2. In horizontal upper portions 36 and 37 of the parts 7, 7' and 6, 6' respectively there are vertical threaded holes, into which are screwed screws 14 and 15 which rest by means of their conical tips againt the laminating rollers 2 and 3 respectively and which prevent these from being displaced laterally out of the jaws (see FIG. 1).

Figure 5:
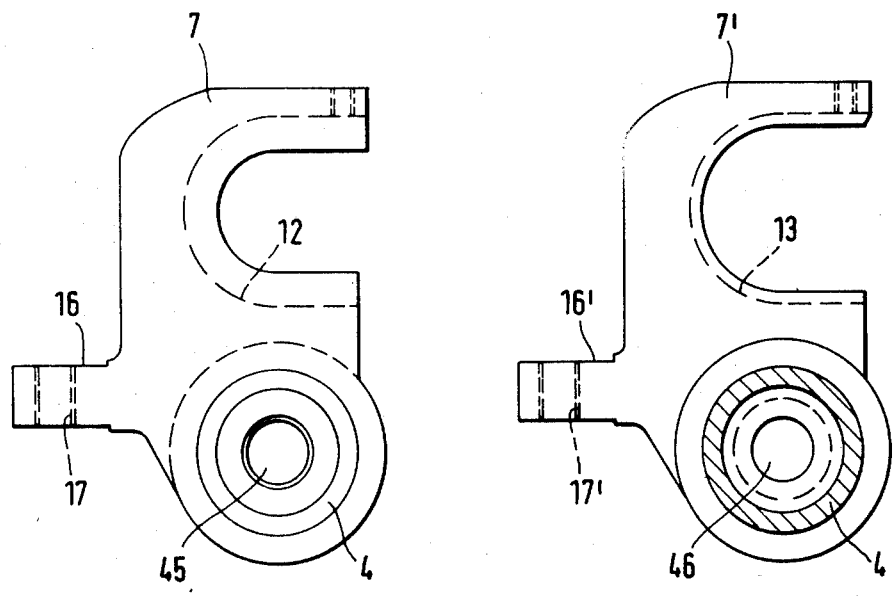
FIG. 5 shows details of the movable parts of the laminating station.

On the outside of one movable part 7 of the parallel rocker, FIG. 1 shows a collar 16 containing a threaded through-hole 17, into which a set screw 18 is screwed. Located underneath the collar 16 is a spherical or tubular housing 19 arranged parallel to the torsion and spacer tubes 4 and 5 respectively. The housing 19 is flattened at the top and bottom and has through-holes 20 and 21 in the flattened regions. The housing 19 surrounds a preset screw 23 passing through the through-hole 21 and engaging with a screw nut 24 which rests against the outside of the lower flattened region of the housing 19, and which holds the preset screw 23 in position against the spring force of a compression spring 25. The compression spring 25 surrounds the shank of the preset screw 23, its bottom end being located in a blind hole 22 made in the housing bottom and its top end resting against the underside of a screw head 26 of the preset screw 23. The tip of the set screw 18 rests on the top side of the screw head 26. For the sake of the symmetry of the parallel rocker, the other movable part 7' has a collar 16' with a threaded hole 17', as shown in FIG. 5. A preset screw 23' is surrounded by a spring 25'. The housings 19, 19' arranged symmetrically relative to the center are connected to one another by means of a spacer tube 44.

The force required for pivoting the parallel rocker of the laminating station is preset by means of the set screws 18, 18' in FIG. 1 and the preset screws 23, 23' surrounded by springs 25 and 25' and by means of the screw nuts 24 and 24' respectively. Reference is made below to only one particular part, but it is assumed that the part symmetrically relative to it is actuated and takes effect in the same way. When the screw 18 in FIG. 1 is screwed further into the threaded hole 17, the spring 25 is correspondingly compressed to a greater extent by the preset screw 23 pressed downwards and is held in the desired position as a result of corresponding readjustment of the screw nut 24. The more the spring 25 is compressed, the greater the force to be exerted to pivot the parallel rocker outwards from its position. In other words, the laminating pressure exerted by the laminating roller 2 on the carrier when the carrier runs through the nip d between the laminating rollers 2 and 3 progressively is increased as the springs 25, 25' are compressed. The springs 25, 25', which are compression springs, generally have a linear characteristic, but can also have a characteristic differing from this.

The movable parts 7, 7' form the parallel rocker, comprising the torsion tube 4 and the laminating roller 2, ensuring that, when the nip is enlarged, a purely parallel adjustment of the movable laminating roller 2 takes place relative to the fixed laminating roller 3. The torsion tube 4 transmits the pivoting of the movable laminating roller 2 in a completely uniform manner over its entire length, so that a nip which is constant throughout is obtained. Furthermore, two fixedly mounted gear wheels 31 and 32, the third gear wheel 31 remaining engaged with a second gear wheel 30 even during pivoting of the laminating roller 2, ensure that the same rotational speed as that which the fixed laminating roller 3 receives from a motor 28 is transmitted to the pivoted laminating roller 2 via gear wheels 29, 32, 31 and 30, even when the first gear wheel 29 is disengaged from the second gear wheel 30. This ensures that the two laminating rollers 2 and 3 always have the same peripheral speed.

Figure 2:
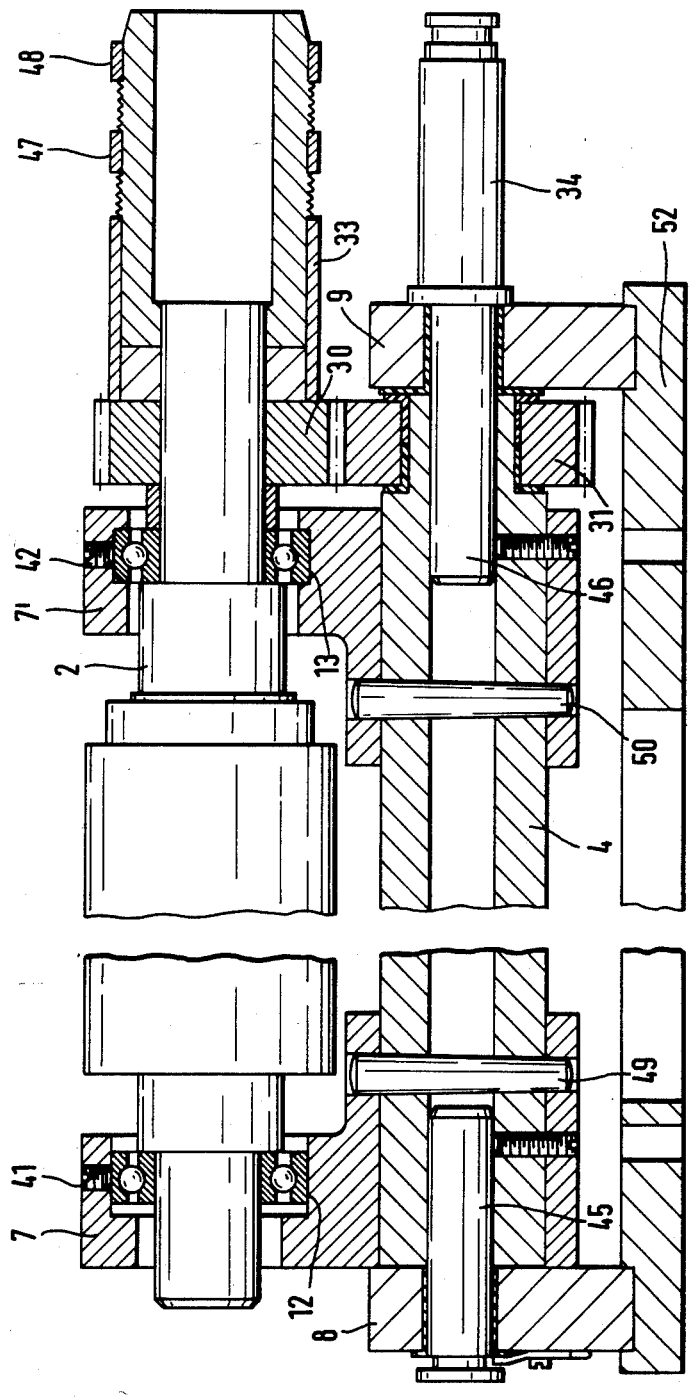
FIG. 2 shows a sectional view of the movable parts of the laminating station, with a torsion tube mounted in the side walls, according to FIG. 1.

FIG. 2 shows, in section, a view of the parallel rocker of the laminating station. A is evident from the drawing, the torsion tube 4 is mounted in the side walls 8 and 9. The stub axle 46 extends beyond the side wall 9, whereas the stub axle 45 terminates flush with the side wall 8. Located above the torsion tube 4 in the parts 7 and 7' are the ball bearing receptacles 12 and 13 for ball bearing 41, 42 resting on the shaft ends of the laminating roller 2. The ball bearing receptacle 12 in the part 7 is stepped, the orifice having the larger radius facing the inside of the part 7 and the orifice having the smaller radius facing the outside of the part 7. In the part 7', the ball bearing receptacle 13 is undercut and has the same diameter as the larger of the two orifices in the part 7. The ball bearing receptacle 12 has in the axial direction of the laminting roller 2 a play which makes it possible to compensate production tolerances when the laminating roller 2 is installed in the parts 7, 7'.

The gear wheel 30 located on the shaft 33 of the laminating roller 2 meshes with gear wheel 31 arranged on a necked-down end of the torsion tube 4. The gear wheels 30 and 31 are between the outer surfaces of the part 7' of the parallel rocker and the inner surface of the side wall 9. Sliding terminals 47, 48 for supplying current to heat the laminating roller 2 are attached to the shaft 33 of the laminating roller 2, this shaft being extended beyond the side wall 9. Both the extended shaft 33 and the extended torsion axle 34 of the torsion tube 4 are mounted in the side part of a frame (not shown).

The torsion tube 4 is connected rigidly to the parts 7, 7' by means of pins 49, 50, such as for example, knocked-in tapered pins, and is also glued in addition. The stub axles 45, 46 are appropriately fixed in their positions relative to the torsion tube 4 by means of pins.

Figure 3:
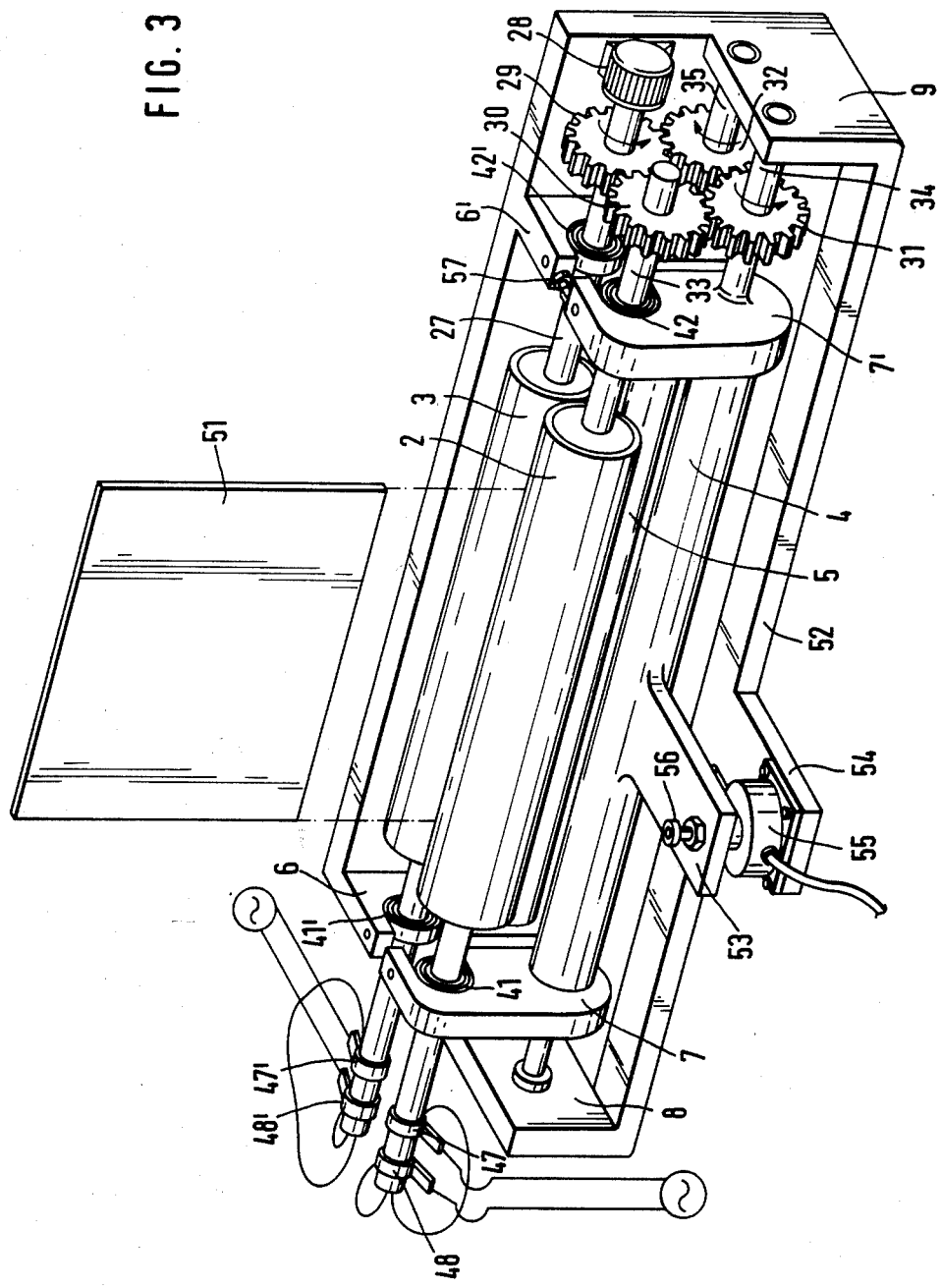
FIG. 3 shows a perspective view of a second embodiment of the laminating station, with the drive motor and the toothed gearing.
Figure 4:
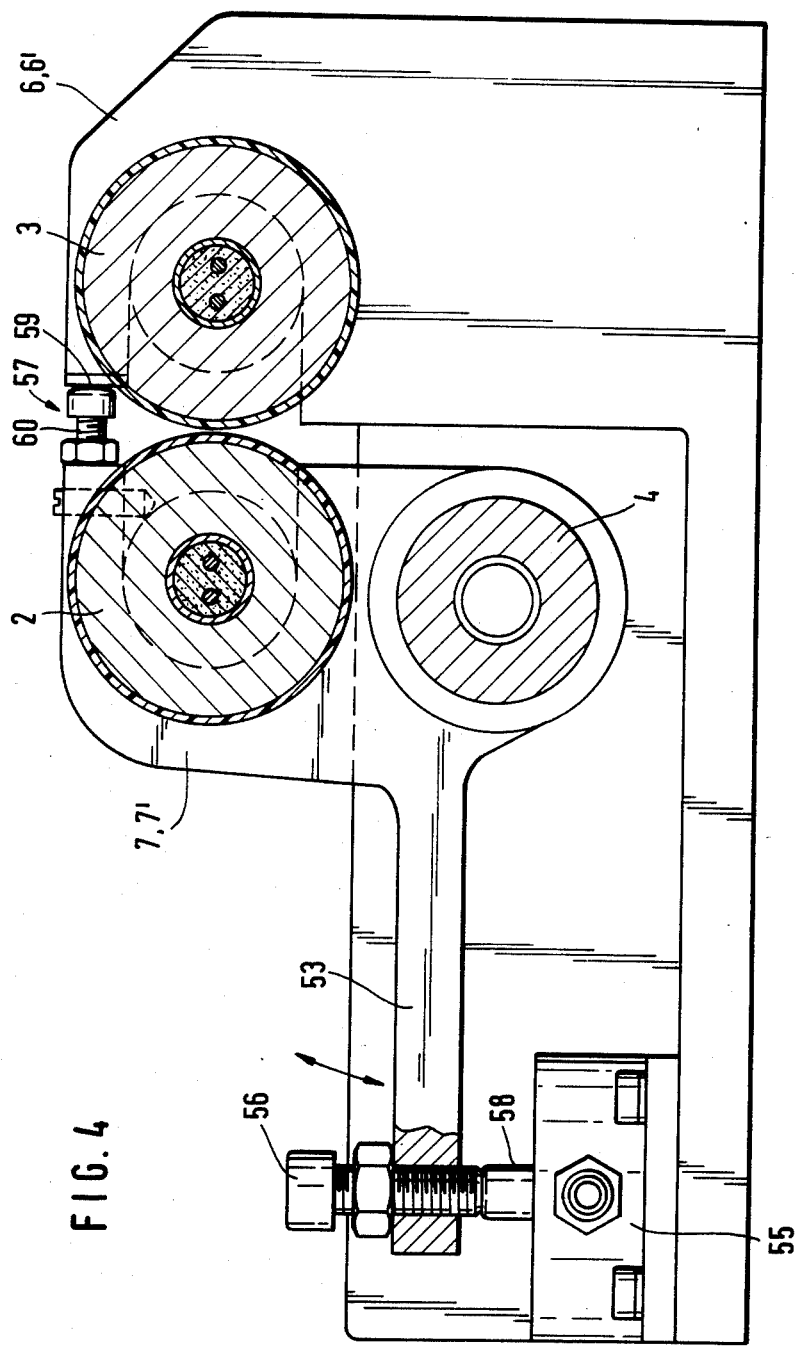
FIG. 4 shows a sectional view of the laminating station according to FIG. 3.

FIG. 3 shows in perspective another embodiment of the laminating station 1, FIG. 4 illustrating a sectional side view of this. A carrier 51 is introduced vertically from above into the nip between the two laminating rollers 2 and 3. The torsion tube 4 is mounted by means of its torsion axle 34 in the side parts 8, 9 of a frame 52. On the right-hand side, the third gear wheel 31 is located on the torsion axle 34 and meshes laterally with the fourth gear wheel 32 on the bolt 35 and with the second gear wheel 30 located above it on the shaft 33 of the laminating roller 2. The first gear wheel 29 is located on the shaft 27 of the laminating roller 3 which the motor 28 drives.

In this embodiment, in contrast to the embodiment according to FIG. 2, the sliding terminals 47, 48 and 47', 48' for supplying current to heat the laminating rollers 2 and 3 respectively are arranged on the ends of the shafts 27 and 33 which do not carry the gear wheels 29 and 30. An adjusting device 57 for the nip required between the laminating rollers 2 and 3 acts between the movable part 7' and the fixed part 6' and has the same design as the adjusting devices 10, 10' in FIG. 1. Although not illustrated, a further adjusting device of this type can also act between the movable part 7 and the fixed part 6. The adjusting device 57 is arranged in the upper region of the parts 6' and 7' and above the laminating rollers 2, 3 and makes it easier to adjust the nip than the adjusting devices 10, 10' in FIG. 1, the latter being located underneath the laminating rollers 2, 3 and therefore being less readily accessible.

The shafts 27, 33 of the laminating rollers 2, 3 are mounted in the parts 6, 6' and 7, 7' by means of ball bearings 41', 42' and 41, 42 respectively.

In this embodiment, the parallel rocker is pivoted by means of a pneumatic cylinder 55 which is fastened to a projection 54 of the base plate of the frame 52 and the cylinder piston rod 58 of which, as shown particularly in FIG. 4, rests against a locked set screw 56, extending through a lever arm 53. The lever arm 53 is connected centrally to the torsion tube 4, by for example welding to the latter. The mode of operation of the pneumatic cylinder 55 corresponds to that of a pneumatic spring which presses the lever arm 53 upwards with a constant pressure and which pivots the parallel rocker, comprising the laminating roller 2, torsion tube 4, and movable parts 7, 7', until the set screw 60 of the adjusting device 57 comes up against a stop surface 59 of the fixed part 6'. The carrier running into the nip between the laminating rollers 2, 3 is slightly thicker than the nip and presses the laminating roller 2 and consequently the parallel rocker down to the left in FIG. 4 in a semicircular path.

The lever arm 53 is thereby pivoted downwards, and the set scrw 56 presses the cylinder piston rod 58 into the pneumatic cylinder 55 until an equilibrium is established between the cylinder pressure and the pressure exerted by the parallel rocker via the lever arm 53 on the cylinder piston rod. In this state of equilibrium, a sufficient laminating pressure is exerted on the carrier by the laminating roller.

As shown in FIG. 3, a motor 28 driving the laminating roller 3 is located on a shaft 27 of the laminating roller 3 mounted in the fixed parts 6, 6' by means of ball bearings 41', 42'. The first gear wheel 29 is located on the shaft 27 between the part 6' and the motor 28. The second gear wheel 30 is located on the shaft 33 of the laminating roller 2 which is mounted, by means of the ball bearings 41, 42, in the movable parts 7, 7' of the laminating station. Underneath the laminating rollers 2 and 3 are the torsion tube 4 and the spacer tube 5. The torsion axle 34 carries the third gear wheel 31, and a bolt 35 mounted in the part 6' and in the side wall 9 carries the fourth gear wheel 32. The gear wheels 31 and 32 mesh with one another, and moreover the third gear wheel 31 meshes with the second gear wheel 30 and the fourth 32 meshes with the first gear wheel 29.

FIG. 5 shows the two movable parts 7, 7' of the laminating station 1. The two parts 7 and 7' are virtually identical as regards their contours and have the collars 16, 16' which project outwards and through which the threaded holes 17 and 17' respectively extend vertically. The tongue-shaped ball bearing receptacle 12 in the part 7 receives one end of the laminating roller 2. The diameter of the larger of the two marked semicircles of the tongue-shaped ball bearing receptacle is equal to the diameter of the circle, marked by a broken line, of the tongue-shaped ball bearing receptacle 13 of the part 7'. The stub axles 45 and 46 (see FIG. 2) and the torsion tube 4, which is mounted in the side walls 8 and 9 by mean of the stub axles 45 and 46 and which projects beyond the side wall 9, are indicated in the parts 7 and 7' underneath the ball bearing receptacles 12 and 13.

What is claimed is:

1. A laminating station for laminating carriers, comprising:
    a frame including sidewalls;
    a pair of heated laminating rollers having an adjustable nip therebetween, the first of said rollers mounted on both sides in movable parts of the laminating station, the second of said rollers mounted on both sides in fixed parts of the laminating station;
    a torsion tube pivotably connected with said movable parts below said first roller, said torsion tube functioning as an axle and being mounted in said sidewalls of said frame, said movable parts being pivotable as a unit with said torsion tube; and
    a spacer tube mounted in said fixed parts below said second roller;
    wherein said movable parts, said first roller and said torsion tube form a parallel rocker; and
    wherein said parallel rocker exerts an adjustable pressure on a carrier as said carrier passes through said nip; and
    wherein said movable parts of said parallel rocker each have a collar rigidly connected thereto, each said collar containing a threaded through-hole into which a set screw is screwed, said pressure being adjustable by means of said set screw.

2. The laminating station as claimed in claim 1, wherein sliding terminals connected to current sources for heating the laminating rollers are located on the end portions of the shafts of said laminating rollers.

3. The laminating station as claimed in claim 1, wherein said nip is fixed between the laminating rollers by at least one adjusting device engageable with one of said fixed parts or said movable parts and against which rests respectively the corresponding movable part or fixed part.

4. The laminating station as claimed in claim 3, wherein said adjusting device is a set screw which is screwed horizontally into the fixed part, and wherein the movable part of the laminating station rests against the screw head of the set screw.

5. The laminating station as claimed in claim 1, wherein the movable parts of the parallel rocker each have a tongue-shaped ball bearing receptacle, and wherein screws passing vertically through the horizontal upper portions of the movable parts prevent the first laminating roller from being displaced laterally out of the ball bearing receptacles.

6. The laminating station as claimed in claim 5, wherein one laminating roller is mounted by means of ball bearings in ball bearing receptacles of the movable parts, and the other laminating roller is mounted by means of ball bearings in said fixed parts.

7. The laminating station as claimed in claim 1, wherein located underneath each of the collars and parallel to the torsion tube is a spherical or tubular housing which is flattened at the top and bottom, and wherein each said housing has upper and lower through-holes in the flattened regions.

8. The laminating station as claimed in claim 7, wherein a blind hole is made in each said housing bottom above the lower through-hole, and wherein there is inside said housing a preset screw which passes through the lower through-hole and which is engaged with a screw nut resting against the outside of the lower flattened region of the housing.

9. The laminating station as claimed in claim 8, wherein a spring surrounds each said preset screw and is supported at its bottom end in the blind hole against the housing bottom and at its top end against the underside of the screw head of the preset screw.

10. The laminating station as claimed in claim 1, wherein said set screw rests by means of its tip against the top side of the screw head of the preset screw.

11. The laminating station as claimed in claim 1, wherein a motor drives the shaft of the laminating roller mounted in the fixed parts, wherein a first gear wheel is located on the shaft between the motor and one of the fixed parts, wherein a second gear wheel is located on a shaft of the laminating roller mounted in the movable parts and is releasably engageable with said first gear wheel, and wherein the first and second gear wheels are engaged with further gear wheels which are mounted fixedly on a torsion axle of the torsion tube and on a bolt, respectively.

12. The laminating station as claimed in claim 3, wherein the adjusting device is arranged underneath the laminating station.

13. The laminating station as claimed in claim 3, wherein the adjusting device is arranged above the laminating rollers.

14. A laminating station for laminating carriers, comprising:
    a frame including sidewalls;
    a pair of heated laminating rollers having an adjustable nip therebetween, the first of said rollers mounted on both sides in movable parts of the laminating station, the second of said rollers mounted on both sides in fixed parts of the laminating station;
    a torsion tube pivotably connected with said movable parts below said first roller, said torsion tube functioning as an axle and being mounted in said sidewalls of said frame, said movable parts being pivotable as a unit about said torsion tube, and forming with said first roller and said torsion tube, a parallel rocker;
    a spacer tube mounted in said fixed parts below said second roller; and
    a pneumatic cylinder for pivoting said parallel rocker, said cylinder interacting with a lever arm rigidly connected to said torsion tube;
    wherein said parallel rocker exerts an adjustable pressure on a carrier as said carrier passes through said nip.

15. The laminating station as claimed in claim 14, wherein the lever arm is connected centrally to the torsion tube and extends radially away therefrom, and wherein a locked set screw is screwed into a threaded bore of the lever arm, passes through said bore and rests by means of its end against a cylinder piston rod projecting from said pneumatic cylinder.

16. The laminating station as claimed in claim 14, wherein said pneumatic cylinder is fastened to a projection of the frame underneath the lever arm and is continuously under pressure during the laminating operation.

* * * * *